United States Patent
Köhler et al.

(10) Patent No.: US 12,366,621 B2
(45) Date of Patent: Jul. 22, 2025

(54) METHOD FOR CALIBRATING GRADIENT AMPLIFIERS OF A MAGNETIC RESONANCE APPARATUS, MAGNETIC RESONANCE APPARATUS, AND COMPUTER PROGRAM PRODUCT

(71) Applicant: Siemens Healthcare GmbH, Erlangen (DE)

(72) Inventors: Michael Köhler, Nuremberg (DE); Andreas Krug, Fürth (DE)

(73) Assignee: Siemens Healthineers AG, Forchheim (DE)

( * ) Notice: Subject to any disclaimer, the term of this patent is extended or adjusted under 35 U.S.C. 154(b) by 183 days.

(21) Appl. No.: 18/225,665

(22) Filed: Jul. 24, 2023

(65) Prior Publication Data
US 2024/0027553 A1    Jan. 25, 2024

(30) Foreign Application Priority Data
Jul. 25, 2022  (DE) .................. 10 2022 207 586.2

(51) Int. Cl.
G01R 33/385    (2006.01)
G01R 33/48     (2006.01)
G01R 35/00     (2006.01)

(52) U.S. Cl.
CPC ....... *G01R 33/3852* (2013.01); *G01R 35/005* (2013.01)

(58) Field of Classification Search
CPC .................. G01R 35/005; G01R 33/3852
See application file for complete search history.

(56) References Cited

U.S. PATENT DOCUMENTS 6,242,919 B1 *  6/2001  Zuk ................. G01R 33/285
                                                 324/318
2014/0084929 A1   3/2014  Choi et al.
(Continued)

FOREIGN PATENT DOCUMENTS

CN    103654787 A    3/2014
CN    105301536 A    2/2016
(Continued)

OTHER PUBLICATIONS

Ertan, Koray et al., Driving mutually coupled gradient array coils in magnetic resonance imaging, Magnetic resonance in medicine; 2019, 82. Jg., Nr. 3; pp. 1187-1198; DOI 10.1002/mrm.27768.
(Continued)

*Primary Examiner* — Alesa Allgood
(74) *Attorney, Agent, or Firm* — Lempia Summerfield Katz LLC (57) ABSTRACT

A method for calibrating gradient amplifiers of a magnetic resonance apparatus is provided. The magnetic resonance apparatus includes one or more gradient coils that include at least two coil segments configured to generate a gradient magnetic field with a gradient in a spatial direction, and a gradient amplifier for each of the at least two coil segments. The gradient amplifier is configured to supply the respective coil segment with electric current. A plurality of magnetic field distributions are measured, each being generated via at least one coil segment of the at least two coil segments. For measuring each magnetic field distribution of the plurality of magnetic field distributions, the at least one coil segment that generates the respective magnetic field distribution is supplied with a predetermined electric current via the respective gradient amplifier. The gradient amplifiers are calibrated via a comparison of the plurality of measured magnetic field distributions.

18 Claims, 4 Drawing Sheets

(56) References Cited

U.S. PATENT DOCUMENTS

2018/0120393 A1\* 5/2018 Atalar .................. G01R 33/022
2021/0106251 A1   4/2021 Lips et al.
2021/0106254 A1\* 4/2021 Hurtado .............. A61B 5/6832

FOREIGN PATENT DOCUMENTS

CN      108872898 A    11/2018
CN      112136056 A    12/2020
CN      112824921 A     5/2021

OTHER PUBLICATIONS

Michael Wendt, MRI Hot Topics. Second Order Shimming of high field magnets, Siemens Medical Solutions USA, Inc.; (https://mriquestions.com/active-shimming.html)—retrieved on Mar. 14, 2023; 1-4 pp.

Klassen, L. Martyn et al., Robust automated shimming technique using arbitrary mapping acquisition parameters (RASTAMAP), Magnetic Resonance in Medicine: An Official Journal of the International Society for Magnetic Resonance in Medicine, 2004, 51. Jg., Nr. 5; pp. 881-887.

\* cited by examiner

METHOD FOR CALIBRATING GRADIENT AMPLIFIERS OF A MAGNETIC RESONANCE APPARATUS, MAGNETIC RESONANCE APPARATUS, AND COMPUTER PROGRAM PRODUCT

This application claims the benefit of German Patent Application No. DE 10 2022 207 586.2, filed on Jul. 25, 2022, which is hereby incorporated by reference in its entirety.

BACKGROUND

The present embodiments relate to a method for calibrating gradient amplifiers of a magnetic resonance apparatus, a magnetic resonance apparatus, and a computer program product.

In medical technology, imaging using magnetic resonance (MR), also referred to as magnetic resonance tomography (MRT) or magnetic resonance imaging (MRI), is distinguished by high soft-tissue contrast levels. Herein, a human or animal patient is typically positioned in an imaging space of a magnetic resonance apparatus. During a magnetic resonance scan, high-frequency excitation pulses are typically radiated into the patient with the aid of a high-frequency antenna unit of a magnetic resonance apparatus.

To be distinguished therefrom is a magnetic field generated by a magnetic coil unit of the magnetic resonance apparatus that typically includes a static main magnetic field and/or a gradient magnetic field. The main magnetic field, also referred to as the B0 field, is generated by a main magnet (e.g., a superconducting main magnet). The gradient magnetic field is generated by a gradient coil unit of the magnetic resonance apparatus and is typically used for position encoding. The gradient coil unit may include a plurality of gradient coils, where each gradient coil of the plurality of gradient coils is configured for generating a gradient magnetic field (e.g., a partial gradient magnetic field) in a particular spatial direction and/or along a particular gradient axis (e.g., X, Y, and Z). These spatial directions thus typically correspond to the gradient axes of the magnetic resonance apparatus.

Nuclear spins are excited in the patient by the excitation pulses generated, so that positionally encoded magnetic resonance signals are triggered. The magnetic resonance signals are received by the magnetic resonance apparatus and are used for the reconstruction of magnetic resonance mappings.

Gradient coils that are segmented into a plurality of coil segments are known. Each coil segment of the plurality of coil segments is supplied with electric current (e.g., powered via a gradient amplifier (or gradient power amplifier, GPA)).

Only when these coil segments are fed evenly with current is a desired gradient-like magnetic field generated in a spatial direction. In general, therein, an effort is made to have the gradient magnetic fields generated be as linear as possible in the respective spatial direction and to generate no or only negligible contributions of higher spatial orders.

If, however, the currents of the individual gradient amplifiers that generate the coil segments for a gradient axis are not equal, field contributions of higher spatial order may arise. The magnetic field generated is then no longer completely gradient-like. Possible effects may be, for example: Distortions of the magnetic resonance mappings, since typical image reconstructions proceed from strictly gradient-like magnetic fields; coupling in the shim coils—If magnetic field distributions are generated that correspond to those of possibly existing coils for magnetic field homogenization (e.g., shim coils), then the fields generated may induce currents in these coils and destroy the coils and the electronics connected to the coils; and generating torques and forces on parts of the gradient coils, which may lead to excessive mechanical loads.

Usually, gradient amplifiers have the most accurate possible current sensors that monitor the actually generated current and are used for regulating the actually generated current. However, these current sensors may have inaccuracies, for example, due to production-related component tolerances. If the accuracies of the individual current sensors of the gradient amplifiers that power the partial coils of a gradient axis deviate from one another, the currents generated by them may deviate from one another, which may lead to the aforementioned problem.

Similarly, variations (e.g., different resistances) in the individual segments of the gradient coil may also have the result that the overlaying of the partial fields generated by the individual segments may lead to unwanted field components of higher spatial order.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a gradient magnetic field generated by gradient coils that are powered by a plurality of gradient amplifiers may be improved. For example, spatial linearity of the generated gradient magnetic field may be improved.

Accordingly, a method for calibrating gradient amplifiers of a magnetic resonance apparatus is provided. Therein, the magnetic resonance apparatus includes at least one gradient coil for generating a gradient magnetic field. One or more gradient coils of the at least one gradient coil includes at least two coil segments that are configured to generate (e.g., together) a gradient magnetic field (e.g., common gradient magnetic field) with a magnetic field gradient in a spatial direction (e.g., common spatial direction). These at least two coil segments are thus associated with a gradient axis corresponding to a spatial direction.

The magnetic resonance apparatus includes a gradient amplifier (e.g., dedicated gradient amplifier) for each of the at least two coil segments. The amplifier is configured to supply each (e.g., each associated) coil segment with electric current (e.g., to power the respective coil segment). A plurality of magnetic field distributions are measured, each being generated via at least one coil segment of the at least two coil segments. For measuring each magnetic field distribution of the plurality of magnetic field distributions, the at least one coil segment that generates the respective magnetic field distribution is supplied with a predetermined electric current via each gradient amplifier. The gradient amplifiers are calibrated via a comparison of the plurality of measured magnetic field distributions.

Via the calibration of the gradient amplifiers, any non-linearities of the gradient coils may be reduced. For example, production tolerances of the gradient amplifiers and/or the gradient coils may be entirely or partially offset. For example, current asymmetries in magnetic resonance apparatuses in which more than one amplifier is used per gradient axis may be corrected.

For example, the magnetic resonance apparatus includes three gradient coils, where the three gradient coils are each configured to generate a magnetic field gradient in another spatial direction and/or along another gradient axis. The three spatial directions and/or gradient axes are oriented orthogonally to one another. For example, the magnetic resonance apparatus includes three gradient coils (e.g., a first gradient coil for generating a gradient magnetic field with a magnetic field gradient in an X-direction, a second gradient coil for generating a gradient magnetic field with a magnetic field gradient in a Y-direction, and a third gradient coil for generating a gradient magnetic field with a magnetic field gradient in a Z-direction). The X-direction, the Y-direction, and the Z-direction may be oriented perpendicularly to one another. The vectors of the gradient magnetic fields preferably have an orientation in the same spatial direction (e.g., the Z-direction).

In one embodiment, for each of the three gradient coils, the coil segments of which are supplied with current by at least two gradient amplifiers, a calibration of the gradient amplifiers is carried out. If a gradient coil includes, for example, only one gradient amplifier, normally a calibration of this one gradient amplifier proposed here is not necessary and/or possible.

In one embodiment, via the calibration of the gradient amplifiers, any deviations between the predetermined currents and the actual currents are equalized, so that, for example, the deviations of the actual currents for all the coil segments of the same gradient coil are equal (e.g., the deviations disappear).

The predetermined electric current with which the at least one coil segment that generates the respective magnetic field distribution is supplied is, for example, a nominal and/or desired current. Therefore, the predetermined current does not have to be the actual current with which the at least one coil segment is supplied via the respective gradient amplifier. For example, any deviations between the nominal and/or desired current and an actual current (e.g., flowing through the at least one coil segment) are corrected via the calibration of the gradient amplifiers. For example, any deviations between the nominal and/or desired currents and actual currents (e.g., flowing through the coil segments) are equalized via the calibration of the gradient amplifiers, so that the deviations may become the same for all the coil segments of the same gradient coil.

For example, the predetermined electric current with which the at least one coil segment that generates the respective magnetic field distribution is supplied has a predetermined nominal and/or desired current strength. This does not have to be the actual current strength with which the at least one coil segment is supplied via the associated gradient amplifier. For example, any deviations between the nominal and/or desired current strength and an actual current strength (e.g., flowing through the at least one coil segment) are corrected via the calibration of the gradient amplifiers. For example, any deviations between the nominal and/or desired current strengths and the actual current strengths (e.g., flowing through the coil segments) are equalized via the calibration of the gradient amplifiers, so that the deviations may be the same for all the coil segments of the same gradient coil.

The aim of the calibration is not necessarily that the actual current corresponds to the nominal current, but rather, the alignment of the currents flowing through each of the different coil segments of a gradient coil and/or a gradient axis.

The calibration of the gradient amplifiers may include, for example, an establishment of at least one correction factor. The at least one correction factor may be applied to the predetermined (e.g., nominal and/or desired) current (e.g., multiplied thereby).

At least one of the gradient coils includes at least two coil segments. For example, the first gradient coil may include two coil segments, the second gradient coil may include two coil segments, and the third gradient coil may include two coil segments. A gradient coil may, however, also include just one coil segment or more than two coil segments. However, the magnetic resonance apparatus of the present embodiments includes at least one gradient coil with more than just one coil segment. For example, the first gradient coil and the second gradient coil may each include just one coil segment, and the third gradient coil may include four coil segments.

A coil segment may include a conductor arrangement with an interface to connect the coil element to a gradient amplifier. If electric current flows through the conductor arrangement, a magnetic field (e.g., a gradient magnetic field) is generated. A gradient magnetic field may be a magnetic field the strength of which (e.g., magnitude of the vector of the gradient magnetic fields) varies linearly along a spatial direction. It is achieved, via the calibration of the gradient amplifiers, that an overall field and/or a combined field of the gradient magnetic fields of a gradient axis is as linear as possible.

Each coil segment may generate a gradient magnetic field (e.g., a magnetic field with a gradient-like component). Such a gradient magnetic field is in reality typically not perfectly linear, but may also include non-linear components (e.g., components of higher spatial order). In one embodiment, these offset one another if the individual coil segments are fed with current equally. The gradient magnetic fields of the coil segments of the same gradient coil may have a magnetic field gradient in the same spatial direction. The gradient magnetic fields generated via a plurality of coil segments of the same gradient coil may complement one another to form a resultant gradient magnetic field (e.g., overall field), which may have mainly gradient-like components.

Each coil segment may be supplied with electric current by a dedicated gradient amplifier. If, for example, the first gradient coil has two coil segments, then the magnetic resonance apparatus has a dedicated gradient amplifier for each of these two coil segments. A plurality of gradient amplifiers belonging to a plurality of coil segments of the same gradient coil may also be considered to be partial gradient amplifiers since each gradient amplifier of the plurality of gradient amplifiers provides for a part of the gradient amplification for this gradient coil and/or gradient axis.

The gradient amplifiers may be controlled by a system control unit of the magnetic resonance apparatus. For example, the system control unit emits electrical control signals to a gradient amplifier in order to control the gradient amplifier.

A magnetic field distribution may define, for example, at least one strength and/or a direction of a magnetic field (e.g., a gradient magnetic field), dependent upon the spatial location. For example, the strength and/or direction of a magnetic field is associated with a spatial coordinate (e.g., x, y, z). In one embodiment, for each coil segment of the magnetic resonance apparatus that is supplied with current by a gradient amplifier that is to be calibrated, an associated magnetic field distribution is measured.

In order to measure a magnetic field distribution of a coil segment, the associated gradient amplifier supplies the coil element with a predetermined electric current. For example, the predetermined electric current flows through a conductor arrangement of the coil segment and thereby generates a magnetic field. The measurement of the field distributions of the different coil segments may take place sequentially.

A calibration of the gradient amplifiers may include, for example, an alignment of the gradient amplifiers. The comparison of the plurality of measured magnetic field distributions may include, for example, an evaluation of the measured magnetic field distributions. The comparison of the plurality of measured magnetic field distributions may be carried out, for example, via a system control unit of the magnetic resonance apparatus. For example, the magnetic field distributions (e.g., generated via the coil segments) of the same gradient axis are compared with one another. Herein, for example, the magnetic field distributions (e.g., generated via the coil segments) of different gradient axes are not compared with one another.

Using the calibrated gradient amplifiers, a magnetic resonance scan may be carried out. For example, using the calibrated gradient amplifiers, magnetic resonance signals may be recorded. In one embodiment, magnetic resonance mappings generated from such magnetic resonance signals have a lower level of artifacts.

In one embodiment, the predetermined electric current has a current strength that is the same (e.g., nominally the same) for each gradient amplifier to be calibrated. Thereby, the comparison of the plurality of measured magnetic field distributions for calibrating the gradient amplifiers may be carried out particularly easily.

Even if the predetermined electric current has a current strength (e.g., nominal and/or desired current strength) that is the same for each gradient amplifier to be calibrated, the actual current strengths may differ. In one embodiment, any deviations between the current strength (e.g., nominal and/or desired) of the predetermined electric current and the actual current strength are corrected via the calibration of the gradient amplifiers. In one embodiment, any different deviations between the current strength (e.g., nominal and/or desired) of the predetermined electric current and the actual current strength of the individual coil segments are equalized via the calibration of the gradient amplifiers.

In one embodiment, the predetermined electric current has a temporally constant current strength. For example, the current strength during part of a magnetic resonance sequence for measuring the plurality of magnetic field distributions or during the entire magnetic resonance sequence is constant (e.g., also during any gradient pulses for position encoding; for slice selection, phase encoding, and/or frequency encoding).

In one embodiment, the current strengths of the predetermined electric current differ between the gradient amplifiers (e.g., at least one gradient amplifier to be calibrated powers its associated coil segment with a different current strength from another gradient amplifier to be calibrated). In one embodiment, the different current strengths are taken into account in the comparison of the resulting plurality of measured magnetic field distributions.

In one embodiment, the current strength of the predetermined electric current for each gradient amplifier to be calibrated is more than 1 ampere (e.g., a number of amperes). In one embodiment, the current strength of the predetermined electric current is great enough so that the field distribution generated leads to a measurable effect (e.g., to a change in a measured signal phase of magnetic resonance signals from which the magnetic field distribution is determined).

The gradient amplifier is configured to supply the respective coil segment, apart from the predetermined electric current, with further current contributions. These further current contributions may be, for example, electric currents for applying gradient pulses according to a magnetic resonance sequence (e.g., a predetermined magnetic resonance sequence). The predetermined electric current (e.g., for calibrating the gradient amplifier) may then be regarded, for example, as a current offset to the electric currents for applying gradient pulses according to a magnetic resonance sequence (e.g., a predetermined magnetic resonance sequence).

For example, the at least two coil segments of a gradient coil include at least three coil segments. At least one magnetic field distribution of the plurality of magnetic field distributions is generated (e.g., together) via at least two coil segments of the at least three coil segments. If, however, a gradient coil of a gradient axis is subdivided into more than two coil segments and therefore is powered by more than two individual gradient amplifiers, predetermined electric currents may also be applied to different groups of gradient amplifiers (e.g., to two gradient amplifiers if there are, altogether, four gradient amplifiers per gradient axis). The comparison of the resultant magnetic field distributions may then take place, for example, in groups.

In one embodiment, the calibration of the gradient amplifiers includes an establishment of at least one correction factor for the gradient amplifiers. The gradient amplifiers supply current to the respective coil segments in a calibrated state while taking account of the at least one correction factor.

The at least one correction factor may be applied, for example, in an imaging magnetic resonance sequence. In the calibrated state, for example, magnetic resonance signals may then be captured, from which one or more magnetic resonance mappings that have one fewer artifact than without a calibration of the gradient amplifiers may be generated.

The at least one correction factor may include, for example, a plurality of correction factors that become normalized. For example, the normalization may take place with regard to a sum of the plurality of correction factors, for example, so that the sum of the correction factors produces a predetermined value (e.g., 1).

In one embodiment, the measurement of the plurality of magnetic field distributions takes place using a magnetic resonance method (e.g., a Doppler echo method and/or a single echo method with different echo times). For example, the measurement of the plurality of magnetic field distributions includes a capturing of magnetic resonance signals by the magnetic resonance apparatus, where, based on the magnetic resonance signals, the plurality of magnetic field distributions are established. In one embodiment, the measurement of the plurality of magnetic field distributions takes place without the use of external sensors, but only with means that are typically available to the magnetic resonance apparatus in clinical operation.

For example, in a Doppler echo method, the magnetic field distribution may be calculated from the phase difference between the echoes. For this purpose, for example, gradient echo or spin echo-based magnetic resonance sequences may be utilized. In one embodiment, the predetermined electric current provides that via the respective gradient amplifier, a magnetic field distribution is generated, the effect of which is then measured. Any other gradient pulses of the magnetic resonance sequence may, for example, be played out as usual.

In one embodiment, the magnetic resonance signals, based on which the plurality of magnetic field distributions may be generated, are captured with a suitable (e.g., high) readout bandwidth. Therewith, it may be achieved that the predetermined electric current for generating the respective magnetic field distribution causes only a slight or negligible spatial distortion in relevant regions.

Suitable readout bandwidths depend, for example, on how large the applied current is and how the field distributions of the individual segments are. The readout bandwidths may be so high that in the direction of the readout gradient of the magnetic resonance sequence used, no significant distortions caused by the field distribution generated by the current arise. In one embodiment, the readout bandwidth is at least 100 Hz/pixel, at least 300 Hz/pixel, or at least 500 Hz/pixel.

In one embodiment, the measurement of the plurality of magnetic field distributions takes place using a magnetic resonance sequence, where, according to the magnetic resonance sequence, a phase encoding of a direction takes place in which the respective gradient amplifiers cause the field variations that are the greatest and/or the most relevant for the evaluation.

In one embodiment, the direction of the phase encoding is the same as the direction of the spatial direction of the magnetic field gradient that is generated by the at least two coil segments, the magnetic field distributions of which are measured for calibration of the associated gradient amplifiers. The direction of the phase encoding may be selected so that the direction points in the same direction as the respective gradient axis. The background is that there is typically no distortion in the phase encoding direction through variations of the magnetic field. If, therefore, a coil segment generates, for example, a field variation in the X-direction (e.g., if it is therefore a segment of the X-gradient coil), the phase encoding direction should point in the X-direction.

In one embodiment, the comparison of the plurality of measured magnetic field distributions includes a determination of a comparison measure (e.g., a similarity measure). The similarity measure may describe a similarity of the magnetic field distributions. Therein, it may be quantified, for example, how the respective magnetic field distributions (e.g., regions) deviate from one another. In one embodiment, the calibration of the gradient amplifiers takes place with the aim of maximizing the similarity measure (e.g., to influence the respective magnetic field distributions such that magnetic field distributions are as similar as possible in particular regions).

In one embodiment, the comparison of the plurality of measured magnetic field distributions takes place while taking account of the segmentation of the gradient coil (e.g., taking account of the spatial arrangement of the at least two coil elements of the gradient coil).

The segmentation of the gradient coil may take account, for example, of a magnetic field configuration theoretically to be generated via the respective coil segment of the gradient coil.

The spatial arrangement of a coil segment may be specified, for example, via the location and/or the region at which the coil segment is situated within the magnetic resonance apparatus.

In one embodiment, the comparison of the plurality of measured magnetic field distributions includes a comparison of at least two magnetic field distributions of the plurality of magnetic field distributions at a predetermined geometric location. Such a location may be, for example, a point, a line, and/or a plane. This geometric location may be a location at which the two magnetic field distributions may be the same.

If, for example, the gradient coil for the gradient axis X is segmented such that the individual coil segments generate, for example, an identical magnetic field distribution in a central transverse slice (e.g., at Z=0), then as the similarity measure, the magnetic field distributions generated by the associated gradient amplifiers may be compared directly at Z=0. For example, the configuration of the magnetic field distribution generated in the X-direction may be evaluated.

In one embodiment, the at least two coil segments and/or the magnetic field distributions generated by the at least two coil segments have a symmetry (e.g., spatial symmetry), where the comparison of the plurality of measured magnetic field distributions takes place taking account of the symmetry.

The symmetry of two coil segments may be described, for example, via a mirroring of a first magnetic field distribution generated by a first coil segment and of a second magnetic field distribution generated by a second coil segment at a point, a line, or a plane.

In one embodiment, the measurement of a plurality of magnetic field distributions and the calibration of the gradient amplifiers are carried out repeatedly, where the measurement of the plurality of magnetic field distributions takes place while taking account of a previously performed calibration.

In one embodiment, these acts are iterated so often until a convergence of the results is ascertained. As the termination criterion of the iterations, for example, a convergence criterion that requires that the established correction factors differ by no more than a particular value or a particular factor from the value calculated in the preceding iteration may be used.

In one embodiment, the at least one correction factor is varied for use in a subsequent iteration (e.g., in specified acts). For example, the variation from iteration to iteration is 0.5%. In one embodiment, the similarity measure established therewith is compared with the similarity measure of the preceding iteration. The iterations may be carried out, for example, so often until a maximum similarity between the generated field distributions of the individual gradient amplifiers is ascertained.

In one embodiment, in different iteration cycles, particular correction factors for determining final correction factors are interpolated and/or averaged. For example, an interpolation from the iterations with the highest and second highest values of the similarity measure takes place. This procedure suggests itself, for example, if a gradient coil of a gradient axis is subdivided into two segments (e.g., two coil segments).

In addition, a magnetic resonance apparatus is provided that is configured to carry out a method as described above.

The advantages of the magnetic resonance apparatus of one or more of the present embodiments substantially correspond to the advantages of the method for calibrating gradient amplifiers of a magnetic resonance apparatus, as described in detail above. Features, advantages, or alternative embodiments mentioned herein may also be transferred to the magnetic resonance apparatus, and vice versa.

For example, the magnetic resonance apparatus may include a system control unit that is suitable for comparing the plurality of measured magnetic field distributions and/or for calibrating the gradient amplifier. For this purpose, the system control unit may include, for example, one or more processors and/or storage modules.

BRIEF DESCRIPTION OF THE DRAWINGS

Further advantages, features, and details of the invention are disclosed in the description below of embodiments and in the drawings. Parts that correspond to one another are provided with the same reference signs in all the figures.

DETAILED DESCRIPTION

Figure 1:
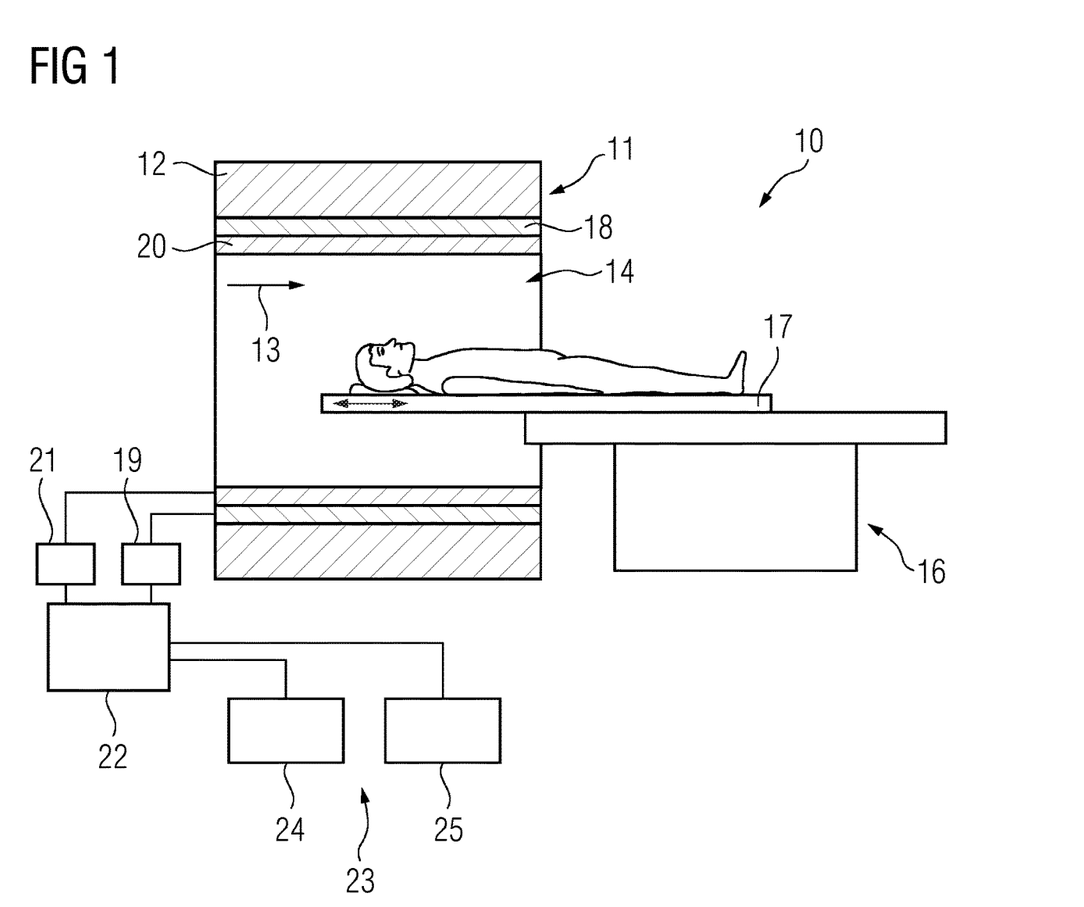
FIG. 1 shows one embodiment of a magnetic resonance apparatus.

FIG. 1 shows one embodiment of a magnetic resonance apparatus 10 schematically. The magnetic resonance apparatus 10 includes a magnet unit 11 that has a main magnet 12 for generating a strong and, for example, temporally constant main magnetic field 13. In addition, the magnetic resonance apparatus 10 includes a patient receiving region 14 for accommodating a patient 15. In the present exemplary embodiment, the patient receiving region 14 is configured cylindrical and is surrounded cylindrically in a circumferential direction by the magnet unit 11. In principle, however, an embodiment of the patient receiving region 14 deviating therefrom may be provided. The patient 15 may be moved by a patient positioning apparatus 16 of the magnetic resonance apparatus 10 into the patient receiving region 14. For this purpose, the patient positioning apparatus 16 has a patient table 17 that is configured to be movable within the patient receiving region 14.

Figure 2:
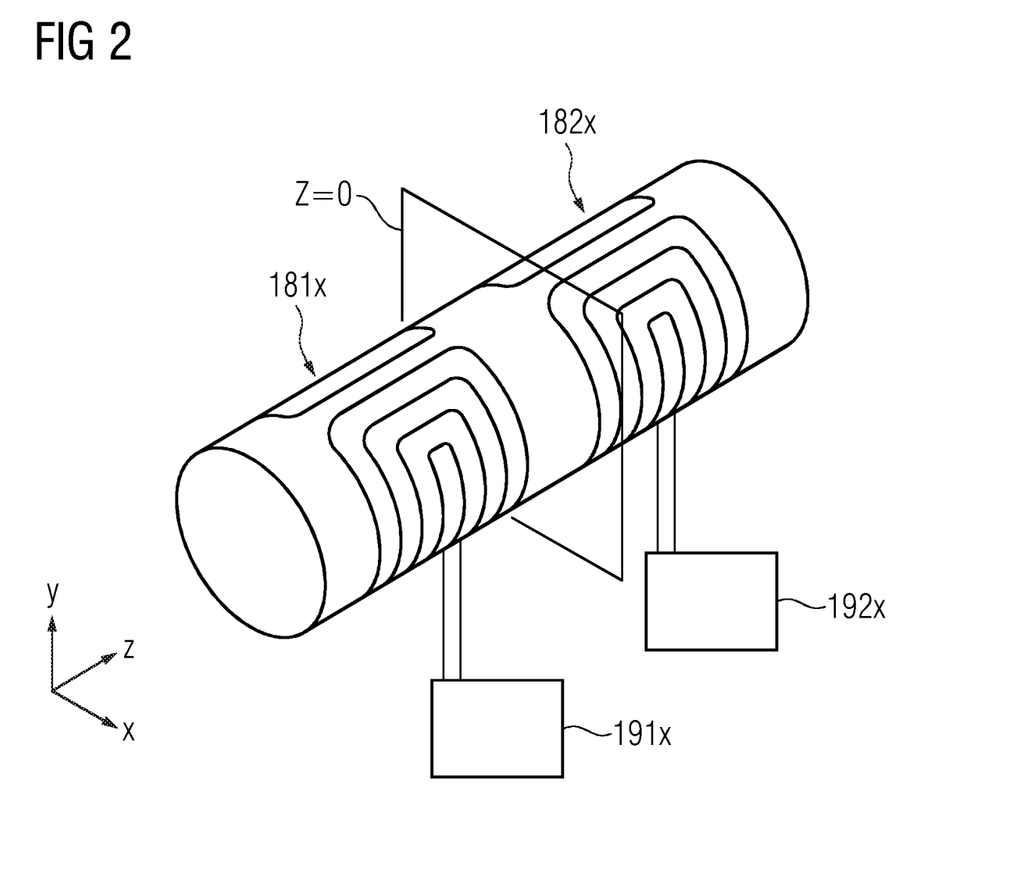
FIG. 2 shows one embodiment of a gradient coil generating magnetic field gradients extending in the X-direction.

The magnet unit 11 also has a gradient coil unit 18 for generating magnetic field gradients that are used for position encoding during an imaging process. The gradient coil unit 18 has three gradient coils (not shown here), where each of the three gradient coils may generate a magnetic field gradient in a spatial direction. FIG. 2 shows, by way of example, two gradient coils 18x for generating a magnetic field gradient in the X-direction. The gradient coil unit 18 is controlled by a gradient control unit 19 of the magnetic resonance apparatus 10. The gradient control unit 19 includes gradient amplifiers (not shown here) for supplying the three gradient coils with electric current. In FIG. 2, by way of example, two gradient amplifiers 191x, 192x for supplying the gradient coil 18x with electric current are shown. The magnet unit 11 further includes a high-frequency antenna unit 20 that is configured in the present exemplary embodiment as a body coil that is firmly integrated into the magnetic resonance apparatus 10. The high-frequency antenna unit 20 is controlled by a high-frequency antenna control unit 21 of the magnetic resonance apparatus 10 and radiates high-frequency magnetic resonance sequences into an examination space, which is substantially formed by a patient receiving region 14 of the magnetic resonance apparatus 10. By this, an excitation of atomic nuclei by the main magnetic field 13 generated by the main magnet 12 takes place. Via relaxation of the excited atomic nuclei, magnetic resonance signals are generated. The high-frequency antenna unit 20 is configured for receiving the magnetic resonance signals.

For controlling the main magnet 12, the gradient control unit 19 and for controlling the high-frequency antenna control unit 21, the magnetic resonance apparatus 10 has a system control unit 22. The system control unit 22 centrally controls the magnetic resonance apparatus 10 (e.g., the execution of a predetermined imaging gradient echo sequence). In addition, the system control unit 22 includes an evaluation unit (not shown in detail) for evaluating the magnetic resonance signals that are captured during the magnetic resonance examination. Further, the magnetic resonance apparatus 10 includes a user interface 23 that is connected to the system control unit 22. Control information such as, for example, imaging parameters and reconstructed magnetic resonance mappings may be displayed on a display unit 24 (e.g., on at least one monitor) of the user interface 23 for medical operating personnel. In addition, the user interface 23 has an input unit 25 by which information and/or parameters may be input by the medical operating personnel during a scanning procedure.

FIG. 2 shows, by way of example, a gradient coil 18x of the gradient coil unit 18 and two gradient amplifiers of the gradient control unit 19. The gradient coil 18x is configured to generate a gradient magnetic field with a magnetic field gradient in the X-direction. The gradient coil unit 18 may also include a corresponding gradient coil for generating a gradient magnetic field with a magnetic field gradient in the Y-direction and/or a gradient coil for generating a gradient magnetic field with a magnetic field gradient in the Z-direction. The vectors of these gradient magnetic fields are typically oriented in the direction of the main magnetic field 13.

The gradient coil 18x includes two coil segments 181x and 182x. Both the coil segments 181x, 182x are configured to generate a gradient magnetic field with a magnetic field gradient in the X-direction. The gradient control unit 19 of the magnetic resonance apparatus includes a gradient amplifier for each of the two coil segments 181x, 182x, specifically the gradient amplifier 191x for the coil segment 181x and the gradient amplifier 192x for the coil segment 182x. The gradient amplifier 191x is configured to supply the coil segment 181x with electric current; the gradient amplifier 192x is configured to supply the coil segment 182x with electric current.

Figure 3:
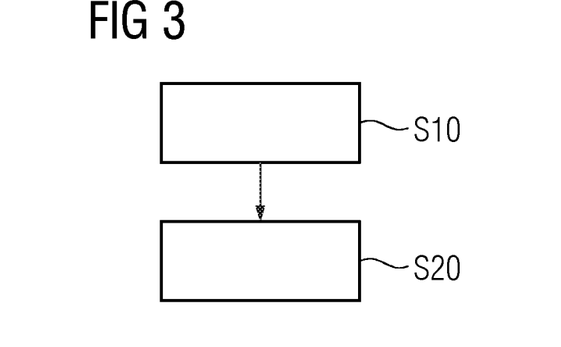
FIG. 3 shows one embodiment of a method for calibrating gradient amplifiers of a magnetic resonance apparatus.

FIG. 3 shows schematically an example of a method for calibrating the gradient amplifier 191x, 192x of the magnetic resonance apparatus 10. In S10, a plurality of magnetic field distributions are measured; each magnetic field distribution of the plurality of magnetic field distributions is generated by the coil segments 181x, 182x. Thus, a first magnetic field distribution that is generated by the coil segment 181x is measured, and a second magnetic field distribution that is generated by the coil segment 182x is measured. For measuring each of the two magnetic field distributions, the coil segment that generates the respective magnetic field distribution is supplied with a predetermined electric current via the respective gradient amplifier. For measuring the first magnetic field distribution, therefore, the coil segment 181x is supplied with a predetermined electric current via the gradient amplifier 191x, and for measuring the second magnetic field distribution, the coil segment 182x is supplied with a predetermined electric current via the gradient amplifier 192x.

The measurement of the magnetic field distribution generated by a gradient coil with conventional magnetic resonance methods presents a difficulty: since, in conventional magnetic resonance methods, the magnetic field distribution is also used for position encoding, a deviation from the ideal linear configuration also brings about a distortion of the coordinate system in which the position encoding takes place. It is, therefore, for example, not possible with conventional magnetic resonance methods that measure the spatial distribution of the magnetic field (e.g., with the field map or B0 map method) to measure the field distribution generated via a pulse from a gradient coil. Since the respective gradient for the position encoding and/or in the image reconstruction is assumed to be linear, the measured field distribution would also appear to be linear.

Rather, it is provided herein to measure with the usual magnetic resonance methods the magnetic field distribution that is generated via the electric currents set (e.g., predetermined) on the individual gradient amplifiers. These electric currents that have been set may each also be applied to the electric currents that are possibly active for a homogenization of the magnetic field (e.g., B0 shimming) and are applied for the gradient pulses of the respective magnetic resonance sequence.

If a gradient coil of a gradient axis is subdivided into more than two segments (e.g., as distinct from the case shown in FIG. 2) and therefore is powered by more than two individual gradient amplifiers, these currents may also be applied to different groups of gradient amplifiers (e.g., to two gradient amplifiers) if there are, altogether, four gradient amplifiers per gradient axis. For such a case, the following description applies similarly; although, then, not single gradient amplifiers but groups of gradient amplifiers are powered.

Such a method will now be described in greater detail by reference to FIG. 4. First, in S11, the predetermined electric current (e.g., a current offset $\Delta I$) is applied to one of N gradient amplifiers of the magnetic resonance apparatus 10. This may be, for example, a number of amperes. The current offset $\Delta I$ is overlaid on another current $I(GPA_1)$, $I(GPA_2)$, ..., $I(GPA_N)$ that is to be supplied by the respective gradient amplifiers. The current offset applied to the gradient amplifiers (e.g., partial gradient amplifiers) may be active during the entire magnetic resonance sequence for measuring the field distribution or during parts thereof. The current offset is selected so that the field distribution generated thereby leads in the magnetic resonance sequence used to a measurable effect (e.g., to a change in the measured signal phase).

Figure 5:
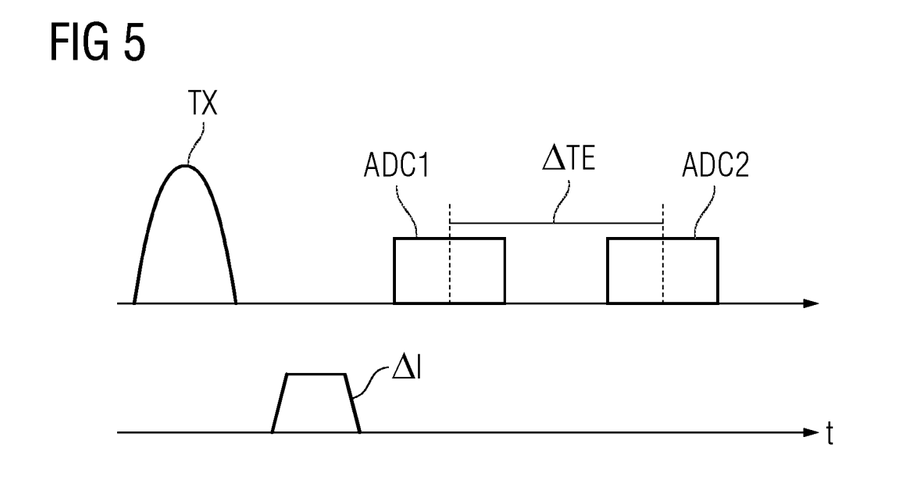
FIGS. 5-6 show examples of elements of magnetic resonance sequences that are suitable for measuring a magnetic field distribution generated via a predetermined electric current on a gradient amplifier.
Figure 6:
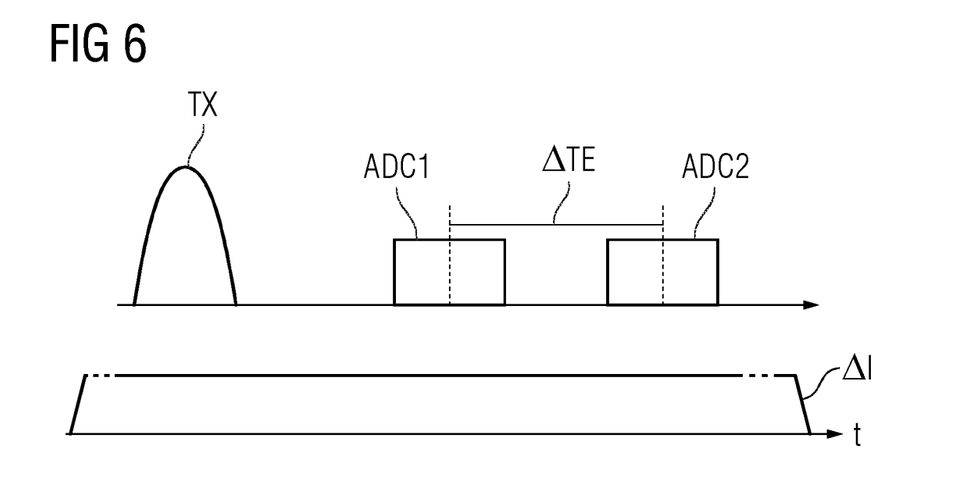

FIGS. 5 and 6 show by way of example elements of magnetic resonance sequences that are suitable for measuring a magnetic field distribution generated via a current offset on a gradient amplifier. According to FIG. 5, the current offset $\Delta I$ is active only during a part of the magnetic resonance sequence, whereas according to FIG. 6, the current offset $\Delta I$ is active during the entire magnetic resonance sequence. Gradients for position encoding (e.g., for slice selection, phase encoding, and/or readout/frequency encoding) are not shown. The reference signs ADC1, ADC2 denote data collection windows, where the echoes are offset by a time $\Delta TE$.

In S12, the field distribution generated by this current offset is measured in each case. This is carried out for all gradient amplifiers of a gradient axis (e.g., which has more than just one gradient amplifier), and/or for each group of gradient amplifiers, which is feasible with a division into more than two segments (see discussion above). Herein, for example, N field distributions are measured, where in each measurement, the current of one of the altogether N gradient amplifiers is modified by a value $\Delta I$.

Subsequently, in S21, the respective field distributions $F_1$, $F_2$, ... $F_N$ of the same gradient axes are compared. If, for example, a first gradient coil of an X-gradient axis of the gradient coil unit 18 includes two coil segments that generate the field distributions $F_{1x}$ and $F_{2x}$, then these field distributions $F_{1x}$ and $F_{2x}$ are compared. If, for example, a second gradient coil of a Y-gradient axis of the gradient coil unit 18 includes two coil segments (e.g., two further coil segments) that generate the field distributions $F_{1y}$ and $F_{2y}$, then these field distributions $F_{1y}$ and $F_{2y}$ are compared. If, for example, a third gradient coil of a Z-gradient axis of the gradient coil unit 18 includes two coil segments (e.g., further coil segments) that generate the field distributions $F_{1z}$ and $F_{2z}$, then these field distributions $F_{1z}$ and $F_{2z}$ are compared. From the field distributions $F_1$, $F_2$, ... $F_N$, in S22, correction factors $K_1$, $K_2$, ..., $K_N$ for the currents and/or the power supply to the individual gradient amplifiers are determined, which provide that the overall field and/or combined field of the gradient magnetic fields of a gradient axis is as linear as possible in the respective spatial direction.

For the measurement of the field distribution in S10, S11, and/or S12, the usual magnetic resonance methods for measuring the magnetic field distribution may be used (e.g., Doppler echo methods with which the field distribution is calculated from the phase difference between the echoes). For this purpose, for example, gradient echo or spin echo-based magnetic resonance sequences may be utilized. The current offset $\Delta I$ of a gradient amplifier may be applied, for example, during the overall magnetic resonance sequence or during parts thereof. The current offset $\Delta I$ provides that a field distribution is generated by the respective gradient amplifier (e.g., partial), the effect of which field distribution is then measured. The other gradient pulses of the magnetic resonance sequence (e.g., with the associated currents $I(GPA_1)$, $I(GPA_2)$, ..., $I(GPA_N)$) are played out as usual (e.g., for these pulses, all the gradient amplifiers and/or coil segments of a gradient axis are powered). The current offset of the respective gradient amplifier to be investigated may thus be added to the currents for generating the other gradient pulses. The sequence may be configured for resolving in one, two, or three dimensions.

Figure 4:
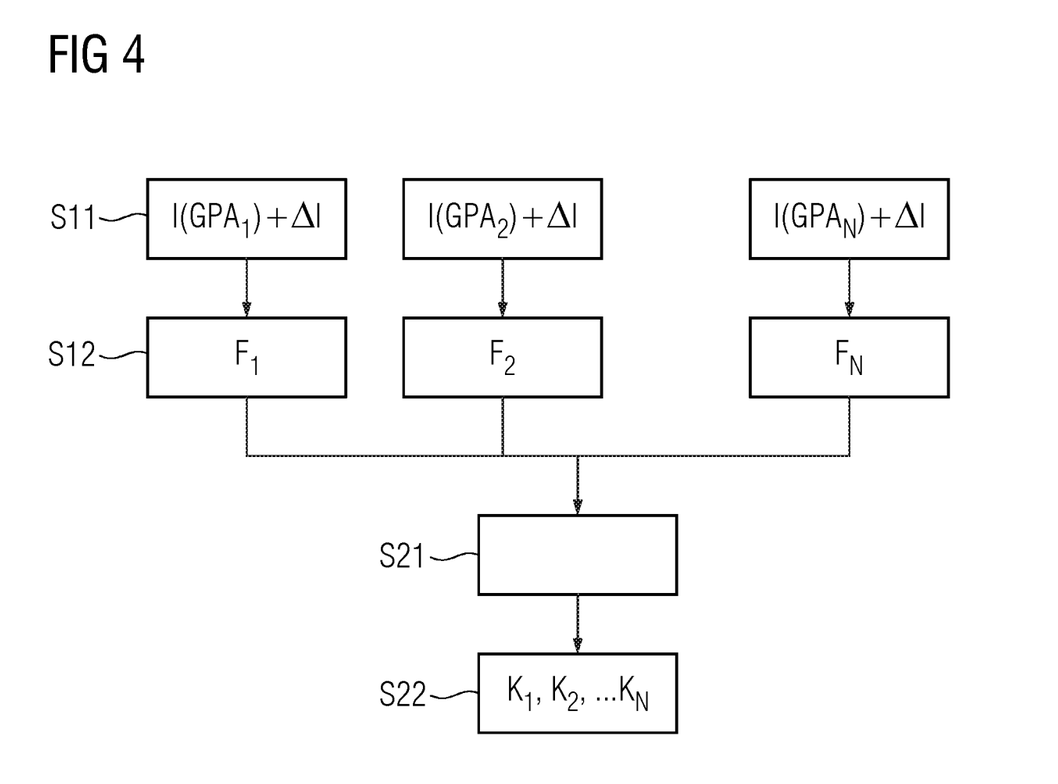
FIG. 4 shows further possible aspects of a method for calibrating gradient amplifiers of a magnetic resonance apparatus.

An example of a sequence element that may be applied for measuring the field distribution generated by the current $\Delta I$ is shown in FIG. 4. The example shows a Doppler echo method that is, for example, embedded in a gradient echo sequence (e.g., where the gradients for position encoding and for generating the echo are not shown). Similarly, other sequences (e.g., spin echo sequences) and other implementations (e.g., single echo methods with different echo times) may be used. In the example, the current $\Delta I$ generates a field distribution $B0(r)$ that generates a spatially varying phase difference between the echoes $\Delta\Phi(I)(r)=\gamma\Delta TE\ B0(r)$ (therein, $\gamma$ is the gyromagnetic ratio, and $\Delta TE$ is the temporal spacing of the echoes). Via the measurement of this phase difference, the field distribution generated $B\ 0(r)$ may be reconstructed.

In one embodiment, the sequence parameters may be selected so that the current offset generates only a slight or negligible spatial distortion in relevant regions. This may be achieved, for example, via the use of a high readout bandwidth or via the selection of the phase encoding direction into the coordinates in which the respective gradient amplifiers produce the field variations that are the greatest and/or the most relevant for evaluation.

For comparison of the measured magnetic field distributions in S20, S21, and/or S22, different methods may be provided (e.g., in order to compare the field distributions $F_1$, $F_2$, ..., $F_N$). Similarity measures may be used in order to compare the magnetic field distributions generated via the respective gradient amplifiers. Therein, it may be quantified, for example, to what extent the respective magnetic field distributions (e.g., regions) deviate from one another.

For this purpose, the specific segmentation of the gradient axes may be taken into account. For example (e.g., as in the case shown in FIG. 2), the gradient coil for the gradient generation along the X-axis may be segmented such that the individual coil segments 181x, 182x in the central transverse plane (e.g., at Z=0) generate the same magnetic field distribution $F_i$. Then, as the similarity measure, the magnetic field distributions generated by the individual gradient amplifiers 191x, 192x may be compared directly at Z=0; for example, the field configuration in the X-direction may then be evaluated. If this field configuration in the magnetic field distributions $F_i$ differs, from this configuration, for example, correction factors for the currents of the individual gradient amplifiers 191x, 192x may be calculated so that both the gradient amplifiers (in this example at Z=0) generate the same magnetic field distributions.

Other comparison measures (e.g., similarity measures) may be used depending on the coil geometry and/or segmentation. In one embodiment, segmentations of gradient coils in which currents on individual gradient amplifiers lead to magnetic field distributions that differ from one another via certain symmetries may be provided. Then, these symmetries may also be taken into account for the comparison of the magnetic field distributions generated via the individual gradient amplifiers.

From the comparison in S21 of the generated field distributions $F_i$, in S22, for example, a set of correction factors $K_i$ is calculated, which is finally applied to the currents of the individual gradient amplifiers. The aim of the correction factors is, for example, to generate field distributions of the individual gradient amplifiers 191x, 192x that are as far as possible identical and/or equivalent, using the comparison or similarity measures used in S21. The overall field of a gradient axis (e.g., while all the gradient amplifiers are powered) may, as far as possible, be linear in the relevant spatial direction. In one embodiment, the sum of the correction factors $K_i$ is normalized, e.g. $K_1+K_2+ \ldots +K_N=1$).

The procedure shown in FIG. 4 may, for example, be iterated until a convergence of the results is ascertained. Therein, for example, the correction factors determined in the preceding step may be applied in the present iteration in order thereby to scale the current offsets $\Delta I$ of the individual gradient amplifiers. As the termination criterion of the iterations, for example, a convergence criterion that requires, for example, that the established correction factors $K_i$ differ by no more than a particular value or a particular factor from the value calculated in the preceding iteration may be used.

In a further possible iterative embodiment, the correction factors $K_i$ are varied in specified steps (e.g., by +/−0.5%) for use in the following iteration. Then, the result of the similarity and/or comparison measure is compared with the corresponding value of the preceding iteration. The iterations may be carried out, for example, so often until a maximum similarity between the generated field distributions of the individual gradient amplifiers is ascertained.

Further, for example, a final set (e.g., initially final set) of the correction factors may be interpolated, for example, from the iterations with the "best" and "second best" values of the comparison measure. This procedure suggests, for example, if a gradient coil of a gradient axis is subdivided into two coil segments.

The method for calibrating gradient amplifiers 191x, 192x of a magnetic resonance apparatus 10 illustrated based on FIGS. 3 and 4 uses current differences for individual gradient amplifiers (e.g., partial gradient amplifiers) of a gradient axis in order to compensate for differences in the coil segments 181x, 182x.

In contrast to possible methods that provide, for example, a calibration of current sensors in the gradient amplifiers or a measurement of an actually generated field distribution by external sensors, a sensor system of this type is not necessary when using the method of the present embodiments. The method is therefore easily usable and may also be utilized easily with already installed magnetic resonance apparatuses in order, for example, to check an adjustment of correction factors and/or to determine new correction factors if in the context of a maintenance, for example, components of the system are exchanged. The method may therefore easily be integrated into the often-used adjustment with magnetic resonance methods in magnetic resonance apparatuses.

The method described above in detail and the magnetic resonance apparatus disclosed are merely embodiments that may be modified by a person skilled in the art in a wide variety of ways without departing from the scope of the invention. Further, the use of the indefinite article "a" or "an" does not preclude the possibility that the relevant features may also be present plurally. Similarly, the expression "unit" does not preclude the relevant components consisting of a plurality of cooperating sub-components that may also be spatially distributed, if relevant.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for calibrating gradient amplifiers of a magnetic resonance apparatus, wherein the magnetic resonance apparatus comprises at least one gradient coil for generating a gradient magnetic field, wherein one or more gradient coils of the at least one gradient coil comprises at least two coil segments that are configured to generate a gradient magnetic field with a magnetic field gradient in a spatial direction, wherein the magnetic resonance apparatus further comprises a gradient amplifier for each of the at least two coil segments, the gradient amplifier being configured to supply each coil segment of the at least two coil segments with electric current, the method comprising:

measuring a plurality of magnetic field distributions, each magnetic field distribution of the plurality of magnetic field distributions being generated by at least one coil segment of the at least two coil segments, wherein for measuring each magnetic field distribution of the plurality of magnetic field distributions, the at least one coil segment that generates the respective magnetic field distribution is supplied with a predetermined electric current by the respective gradient amplifier; and calibrating the gradient amplifiers, the calibrating of the gradient amplifiers comprising comparing the plurality of measured magnetic field distributions.

2. The method of claim 1, wherein by the calibrating of the gradient amplifiers, any deviations between the predetermined electric currents and actual currents are equalized, so that the deviations of the actual currents for all coil segments of the at least two coil segments of a same gradient coil of the one or more gradient coils are equal.

3. The method of claim 1, wherein calibrating the gradient amplifiers comprises:

establishing at least one correction factor for the gradient amplifiers, wherein the gradient amplifiers supply current to the respective coil segments in a calibrated state while taking account of the at least one correction factor.

4. The method of claim 1, wherein measuring the plurality of magnetic field distributions comprises capturing magnetic resonance signals using the magnetic resonance apparatus, and wherein the plurality of magnetic field distributions are established based on the magnetic resonance signals.

5. The method of claim 1, wherein comparing the plurality of measured magnetic field distributions comprises:

determining a similarity measure that describes a similarity of the plurality of measured magnetic field distributions.

6. The method of claim 1, wherein the at least two coil segments have a spatial arrangement, segmentation, or arrangement and segmentation, and wherein the comparing of the plurality of measured magnetic field distributions takes place while taking account of the spatial arrangement, segmentation, or arrangement and segmentation of the at least two coil elements.

7. The method of claim 1, wherein the at least two coil segments, the plurality of magnetic field distributions generated by the at least two coil segments, or the at least two coil segments and the plurality of magnetic field distributions generated by the at least two coil segments have a symmetry, and wherein comparing the plurality of measured magnetic field distributions takes place while taking account of the symmetry.

8. The method of claim 3, wherein the measuring and the calibrating are carried out repeatedly, and wherein measuring the plurality of magnetic field distributions takes place while taking account of a previously performed calibrating of the gradient amplifiers.

9. The method of claim 8, wherein the at least one correction factor is varied for use in a subsequent iteration.

10. The method of claim 8, wherein the repeated execution of the measuring and the calibrating is terminated when a similarity measure determined via the comparing of the plurality of measured magnetic field distributions exceeds a predetermined value, factor, or value and factor.

11. A magnetic resonance apparatus comprising:

at least one gradient coil configured to generate a gradient magnetic field, wherein one or more gradient coils of the at least one gradient coil comprises at least two coil segments that are configured to generate a gradient magnetic field with a magnetic field gradient in a spatial direction; and a gradient amplifier for each of the at least two coil segments, the gradient amplifier being configured to supply each coil segment of the at least two coil segments with electric current, wherein the magnetic resonance apparatus is configured to:

measure a plurality of magnetic field distributions, each magnetic field distribution of the plurality of magnetic field distributions being generated by at least one coil segment of the at least two coil segments, wherein for the measurement of each magnetic field distribution of the plurality of magnetic field distributions, the at least one coil segment that generates the respective magnetic field distribution is supplied with a predetermined electric current by the respective gradient amplifier; and calibrate the gradient amplifiers, the calibration of the gradient amplifiers comprising comparison of the plurality of measured magnetic field distributions.

12. In a non-transitory computer-readable storage medium that stores instructions executable by one or more processors to calibrate gradient amplifiers of a magnetic resonance apparatus, wherein the magnetic resonance apparatus comprises at least one gradient coil for generating a gradient magnetic field, wherein one or more gradient coils of the at least one gradient coil comprises at least two coil segments that are configured to generate a gradient magnetic field with a magnetic field gradient in a spatial direction, wherein the magnetic resonance apparatus further comprises a gradient amplifier for each of the at least two coil segments, the gradient amplifier being configured to supply each coil segment of the at least two coil segments with electric current, the instructions comprising:

measuring a plurality of magnetic field distributions, each magnetic field distribution of the plurality of magnetic field distributions being generated by at least one coil segment of the at least two coil segments, wherein for measuring each magnetic field distribution of the plurality of magnetic field distributions, the at least one coil segment that generates the respective magnetic field distribution is supplied with a predetermined electric current by the respective gradient amplifier; and calibrating the gradient amplifiers, the calibrating of the gradient amplifiers comprising comparing the plurality of measured magnetic field distributions.

13. The non-transitory computer-readable storage medium of claim 12, wherein by the calibrating of the gradient amplifiers, any deviations between the predetermined electric currents and actual currents are equalized, so that the deviations of the actual currents for all coil segments of the at least two coil segments of a same gradient coil of the one or more gradient coils are equal.

14. The non-transitory computer-readable storage medium of claim 12, wherein calibrating the gradient amplifiers comprises:

establishing at least one correction factor for the gradient amplifiers, wherein the gradient amplifiers supply current to the respective coil segments in a calibrated state while taking account of the at least one correction factor.

15. The non-transitory computer-readable storage medium of claim 12, wherein measuring the plurality of magnetic field distributions comprises capturing magnetic resonance signals using the magnetic resonance apparatus, and wherein the plurality of magnetic field distributions are established based on the magnetic resonance signals.

16. The non-transitory computer-readable storage medium of claim 12, wherein comparing the plurality of measured magnetic field distributions comprises:
   determining a similarity measure that describes a similarity of the plurality of measured magnetic field distributions.

17. The non-transitory computer-readable storage medium of claim 12, wherein the at least two coil segments have a spatial arrangement, segmentation, or arrangement and segmentation, and
   wherein the comparing of the plurality of measured magnetic field distributions takes place while taking account of the spatial arrangement, segmentation, or arrangement and segmentation of the at least two coil elements.

18. The non-transitory computer-readable storage medium of claim 12, wherein the at least two coil segments, the plurality of magnetic field distributions generated by the at least two coil segments, or the at least two coil segments and the plurality of magnetic field distributions generated by the at least two coil segments have a symmetry, and
   wherein comparing the plurality of measured magnetic field distributions takes place while taking account of the symmetry.

* * * * *